United States Patent [19]
Mueck et al.

[11] Patent Number: 5,381,148
[45] Date of Patent: Jan. 10, 1995

[54] METHOD AND APPARATUS FOR CALIBRATING A GAIN CONTROL CIRCUIT

[75] Inventors: Michael Mueck, Bradford; Paul F. Ferguson, Jr., Dracut, both of Mass.

[73] Assignee: Analog Devices, Inc., Norwood, Mass.

[21] Appl. No.: 90,799

[22] Filed: Jul. 12, 1993

[51] Int. Cl.⁶ .............................................. H03M 1/10
[52] U.S. Cl. ..................................... 341/139; 341/120
[58] Field of Search ............... 341/139, 120, 118, 144; 330/2, 129

[56] References Cited

U.S. PATENT DOCUMENTS

| | | | |
|---|---|---|---|
| 3,709,309 | 1/1973 | William et al. | 177/165 |
| 4,222,107 | 9/1980 | Mrozowski et al. | |
| 4,272,760 | 6/1981 | Prazak et al. | |
| 4,829,236 | 5/1989 | Brenardi et al. | |
| 4,943,807 | 4/1988 | Early et al. | 341/120 |
| 4,975,864 | 12/1990 | Sendall et al. | 364/571.01 |
| 5,057,840 | 10/1991 | Ledzius et al. | 341/144 |
| 5,087,914 | 2/1992 | Sooch et al. | 341/120 |
| 5,248,970 | 9/1993 | Sooch et al. | |

*Primary Examiner*—Brian K. Young
*Attorney, Agent, or Firm*—Wolf, Greenfield & Sacks

[57] ABSTRACT

A system includes a digital-to-analog converter circuit and a calibration circuit. The digital-to-analog converter circuit includes a gain control circuit providing volume adjustment. The system includes a calibration mode and a normal mode of operation. During calibration, a correction value associated with the gain control circuit is measured by the calibration circuit and stored. During normal operation, the stored correction value is combined with the input before provision of the same to the DAC circuit such that, for a predetermined input of midscale code, the desired system output remains constant despite any change in the volume setting of the gain control circuit.

19 Claims, 3 Drawing Sheets

METHOD AND APPARATUS FOR CALIBRATING A GAIN CONTROL CIRCUIT

FIELD OF THE INVENTION

The present invention relates to gain control circuits and, more particularly, to calibration circuitry to correct for any offset error voltages associated with gain control circuits.

BACKGROUND OF THE INVENTION

In the field of audio electronics, it is often desireable to provide a user-controlled volume feature in an audio component, such as a compact disc player or the like. It is, therefore, common for such components to include gain or attenuation control circuitry for providing such volume control.

With the recent advancement in digital signal processing technology, most audio components found today also include digital circuitry having signal conversion elements such as digital-to-analog converters [hereinafter "DACs"] and analog-to-digital converters [hereinafter "ADCs"]. Such elements, like those of many electrical circuits have DC offset error voltages associated therewith. These offset error voltages can introduce undesired effects in the output signal. Thus, many systems include calibration circuitry for use in minimizing the undesired effects of the offset error voltages. Particularly, DACs and ADCs are commonly calibrated such that any significant offset error voltage is effectively nullified and a desired output signal results from a known input signal. One example of such a calibration scheme is taught in U.S. Pat. No. 5,087,914 to Sooch et al. In the Sooch' 914 patent, a digital correction value for the DAC offset error voltage is determined during a calibration routine and is subtracted from each digital input to the DAC during normal operation. Thus, for a predetermined input of, for example midscale code, a known output signal of, for example, zero volts results. Other similar calibration schemes achieve this same result.

In certain digital audio applications, such calibration schemes are effective at minimizing the deleterious effects of offset voltages. There exist, however, digital audio applications where these calibration schemes produce unwanted results. Specifically, in applications where a constant average DC output voltage is desired for a known input signal, regardless of the attenuation setting, such calibration schemes fail. An example of such an application includes an audio component with digital conversion circuitry (i.e., a DAC) as well as a gain control circuit (providing control of gain and attenuation), and the output of the DAC is AC coupled by a user to external subsequent components such as an amplifier and/or speaker system. With such a circuit arrangement, for a known input of midscale code, a constant average DC output signal (of any value) is desired, regardless of the level of attenuation provided by the gain control circuit. This is so because any discrete changes in the average DC value of the output signal, caused from a discrete change in the level of attenuation (i.e., digital volume control adjustment), will be AC coupled to the speaker system and be heard as a "click" or "pop" by the user. The prior art calibration schemes, described above, produce this unwanted result.

SUMMARY OF THE INVENTION

The aforementioned drawbacks of the prior art schemes are overcome by a method and apparatus of the present invention in which a system is calibrated such that, for a known input signal, the DC output level of the signal will remain substantially constant despite any changes in the level of attenuation provided by a gain control circuit.

More particularly, according to the invention, a system includes a gain control circuit having an input terminal and an output terminal. The gain control circuit receives an input signal on the input terminal and provides an output signal on the output terminal. A calibration circuit, coupled to the gain control circuit, receives the output signal and measures and stores a correction value. A summing block, coupled between the input terminal, the calibration circuit and the gain control circuit, adds the stored correction value to the input signal such that, for a predetermined input signal, the output signal remains substantially constant despite any changes in the amount of gain or attenuation provided by the gain control circuit.

In accordance with a preferred embodiment of the present invention, the gain control circuit includes an operational amplifier having a variable resistor connected in a feedback path thereof to control the amount of gain or attenuation provided by the gain control circuit.

Additionally, in accordance with the preferred embodiment of the present invention, the system further includes a DAC having an input terminal coupled to the summing block and an output terminal coupled to the gain control circuit.

Other advantages, novel features and objects of the invention will become apparent from the following detailed description of the present invention when considered in conjunction with the accompanying drawings.

DETAILED DESCRIPTION

Figure 1:
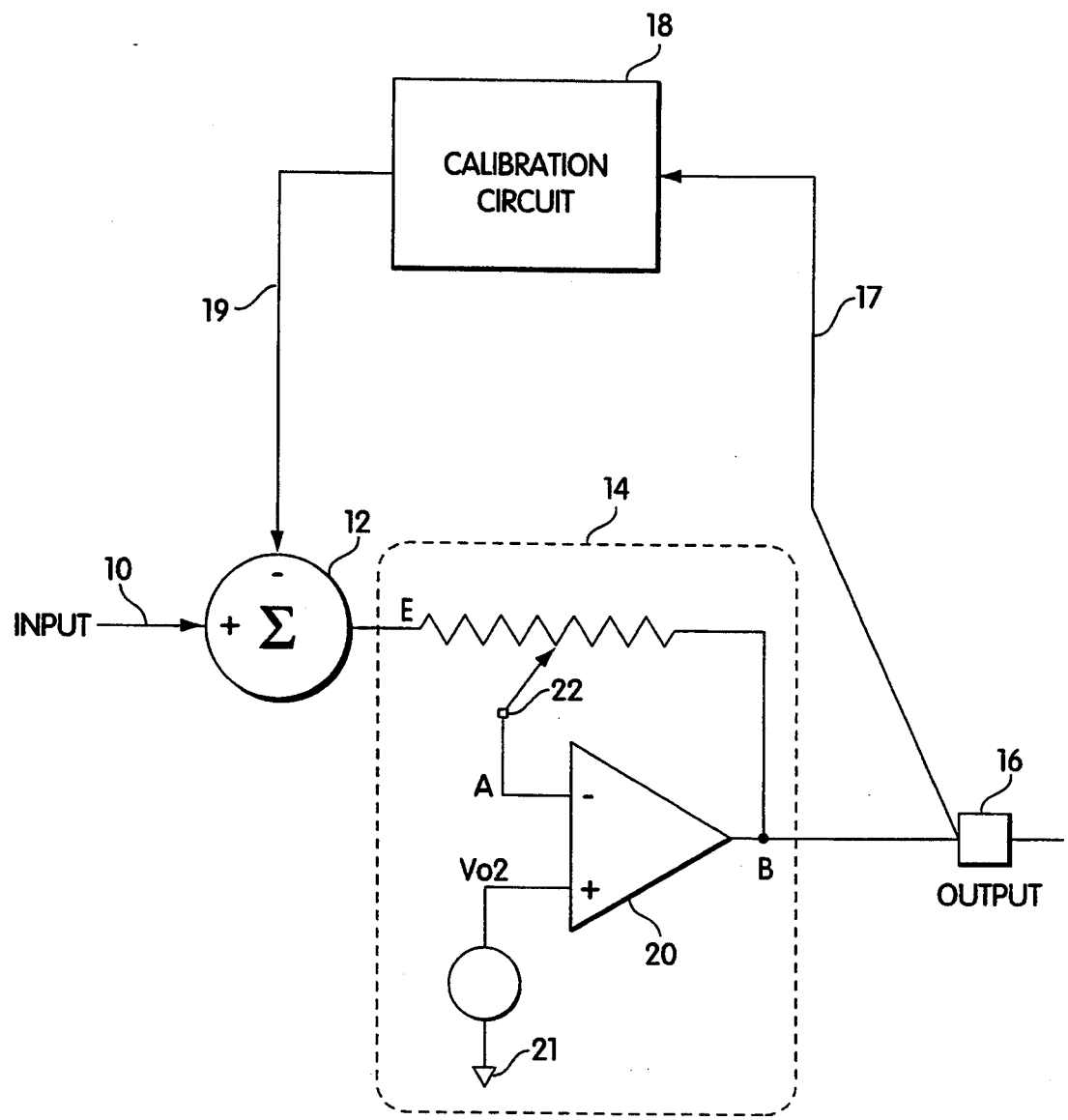
FIG. 1 is a general block diagram of a system according to the present invention.

Referring to FIG. 1, a system is shown including an input terminal 10, a summing block 12, a gain control circuit 14, an output terminal 16 and a calibration circuit 18. The system is operable in either a calibration mode or a normal mode of operation. During normal operation, an input signal is received on input terminal 10 and is fed through summing block 12 to gain control circuit 14. Gain control circuit 14 provides an output signal on output terminal 16. The output of calibration circuit 18 is fed along line 19 and subtracted by summing block 12 from the input signal. As used herein, the term "summing block" denotes any circuit element which performs a mathematical operation on at least a pair of inputs to produce an output. This mathematical operation may include addition or subtraction. The inputs may be in the form of a digital code, a current, a voltage, or a charge.

The gain control circuit 14 provides a volume control function to a user and includes an operational amplifier (op amp) 20 arranged, in this embodiment, as an inverting gain stage with a potentiometer 22 connected in a feedback path between output terminal B and inverting input terminal A of op amp 20. The potentiometer 22 can be adjusted to effect the attenuation/gain of the signal input to the gain control circuit 14 at node E (the output of summing block 12).

It should be understood that the term "gain control circuit", as used herein, denotes any circuit adjustable to provide gain and/or attenuation to an input signal. Such a circuit may be manually, electrically or otherwise controlled and may include a variable impedance circuit. The circuit preferably includes an op amp. While shown in FIG. 1 with an op amp arranged as an inverting gain stage, it is envisioned that the gain control circuit could include an op amp arranged as a non-inverting gain stage.

Also shown in FIG. 1, as a voltage source connected between system common 21 and the non-inverting input terminal of op amp 20, is the offset error voltage $V_{02}$, which is an input referred offset error voltage associated with an otherwise ideal op amp 20.

The calibration circuit 18 operates to ensure that the output voltage, appearing on output terminal 16, remains constant (DC) for a known constant input level regardless of the level of attenuation (setting of potentiometer 22) of the gain control circuit 14. Particularly, during a calibration routine, the calibration circuit 18, from the output signal via feedback path 17, produces and stores a correction value which is subtracted from each input signal by summing block 12 such that, the voltage at nodes A, B and E remains constant at $V_{02}$, for a predetermined input signal, regardless of the level of attenuation of the gain control circuit 14. As described above, such a result is desired, for example, in an audio AC coupling application where a user places an external capacitor (not shown) in series with the output terminal 16, the capacitor essentially acting as a high pass filter to pass AC signals to subsequent components such as an amplifier and speaker system while blocking DC signals.

Figure 2:
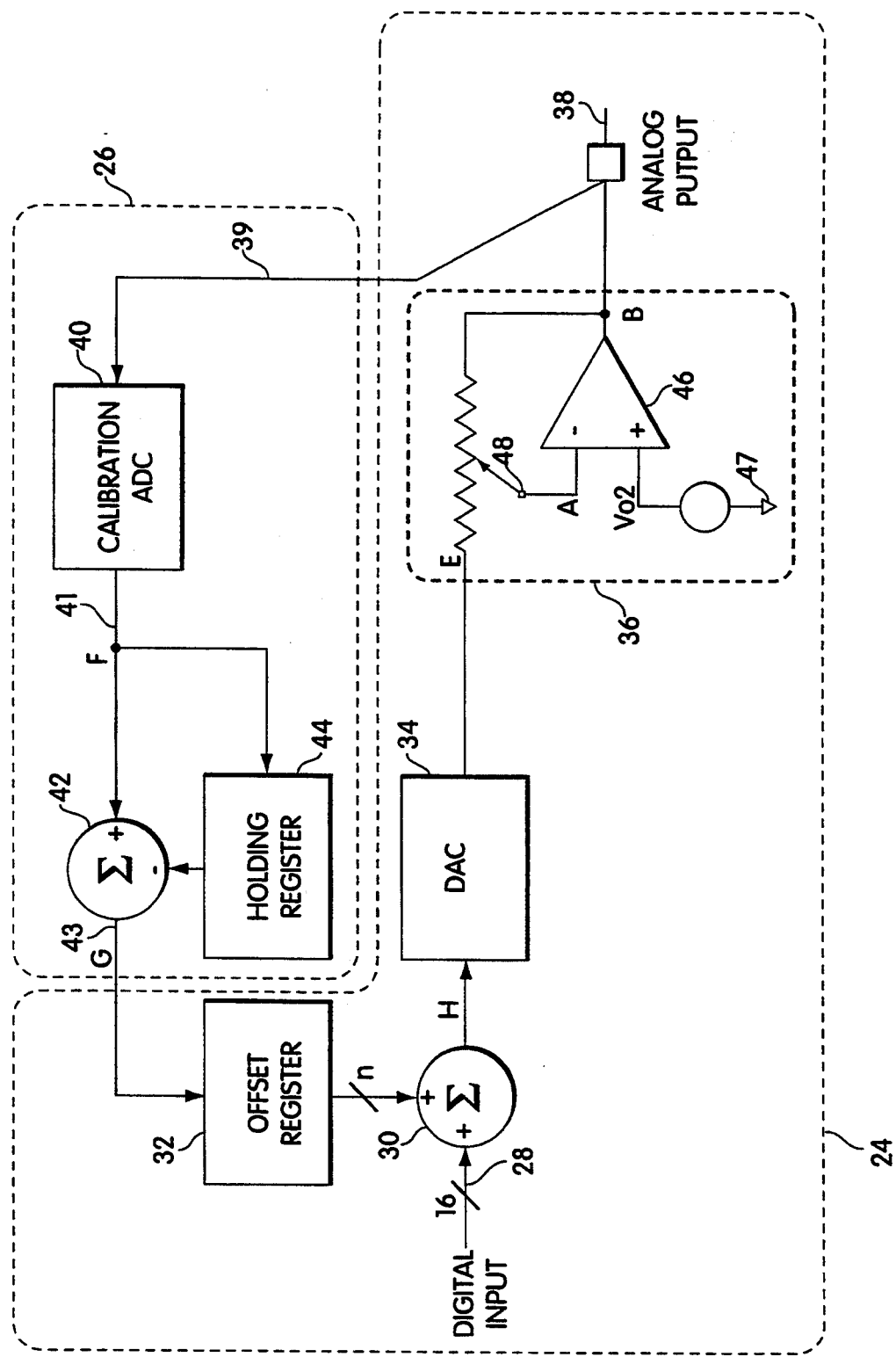
FIG. 2 is a more detailed block diagram of a system according to a first embodiment of the present invention.

FIG. 2 shows, in more detail, a system according to an embodiment of the present invention. The system includes DAC circuitry 24 and a calibration circuit 26. The calibration scheme of the present invention will be described below with reference to FIG. 2.

As shown, the DAC circuitry 24 includes a digital input terminal bus 28, a digital summing block 30, an offset register 32, a DAC 34, a gain control circuit 36, and an output terminal 38. $V_{02}$ (connected between system common 47 and the non-inverting input terminal of op amp 46) represents the input referred offset error voltage of op amp 46. All blocks are assumed to be otherwise ideal.

During normal operation, a digital input signal is received on input terminal 28. A correction value, stored in offset register 32, is added to the digital input signal by summing block 30. The sum is provided to DAC 34 which converts the sum to an analog signal and provides the same to the gain control circuit 36. The gain control circuit 36 provides attenuation or gain, depending on the setting of potentiometer 48, and an output signal is provided on analog output terminal 38.

The calibration circuit 26 includes a calibration ADC 40, a summing block 42, and a holding register 44. During calibration, the correction value is determined and stored in offset register 32. The calibration routine includes two steps, as described below.

In the first step of the calibration routine, the DAC circuitry offset error voltage is measured with the DAC output muted (fully attenuated by the gain control circuit); in the second step, the DAC circuitry offset error voltage is measured without the DAC output muted and with the gain control circuit adjusted to a predetermined gain. During the first step, the potentiometer 48 of the gain control circuit 36 is adjusted until the inverting input terminal A is directly connected ("shorted") to the output terminal B of the op amp 46. This setting mutes the output of the DAC, such that no change in the input signal received on the digital input terminal 28 alters the analog output at node B. The voltage at nodes A and B will be the same and will be equal to $V_{02}$. Therefore, the output voltage on output terminal 38 will be equal to $V_{out\ mute} = V_{02}$. The output voltage, $V_{out\ mute}$, is fed along feedback line 39 to the calibration ADC 40 which converts the output voltage to a digital value. This digital value is stored in the holding register 44. Therefore, holding register 44 contains a digital representation of $V_{out\ mute}$, which is the intended end result of the first calibration step.

During the second calibration step, a known digital input of midscale code is provided on the digital input terminal 28 and the potentiometer 48 is set, in this preferred embodiment, such that the gain of the gain control circuit 36 from node E to node B is equal to $-1$. It should be appreciated, however, that the gain could be set to any non-zero value. With this setting, the voltage at the output terminal 38 is equal to $V_{out\ uncal} = 2 \times V_{02}$, because the voltage of the DAC output terminal E will be at system common and the voltage at the inverting op amp input terminal A will be equal to $V_{02}$. This output voltage, $V_{out\ uncal}$, is similarly fed along feedback line 39 to calibration ADC 40 and is converted thereby to a digital value. This digital representation of $V_{out\ uncal}$ is provided along line 41 to summing block 42. Summing block 42 subtracts the value in the holding register (a digital representation of $V_{out\ mute}$) from the digital representation of $V_{out\ uncal}$ and provides the result (a digital representation of $V_{02}$) along line 43 to offset register 32. Offset register 32 stores this digital result (a digital representation of $V_{02}$), which is equal to a digital representation of the offset error voltage associated with the gain control circuit 36. This completes the calibration routine.

As previously discussed, during normal operation, after the calibration routine is completed, the value stored in the offset register 32 is added to the digital input signal received on digital input terminal 28, by summing block 30, and the sum, appearing at node H, is provided to DAC 34. The digital sum is converted to an analog signal by DAC 34 and the analog signal is provided at node E to the gain control circuit 36. Assuming, for example, that the digital input signal is equal to midscale code, the digital sum appearing at node H is equal to a digital representation of $V_{02}$ and the analog signal appearing at node E is equal to $V_{02}$. The voltage appearing at node A is also equal to $V_{02}$. Accordingly, the voltage at node B will remain at $V_{02}$ regardless of the position of the potentiometer, for a digital input signal of midscale code. In other words, for a digital input signal of midscale code, the output voltage appearing at output terminal 38 is always equal to $V_{02}$, independent of the volume control setting. This is an important and desired result because, in an AC coupling application, for a midscale code input, the user may adjust the volume in discrete steps, and the output voltage will remain constant and no clicks or pops will be heard by the user.

Figure 3:
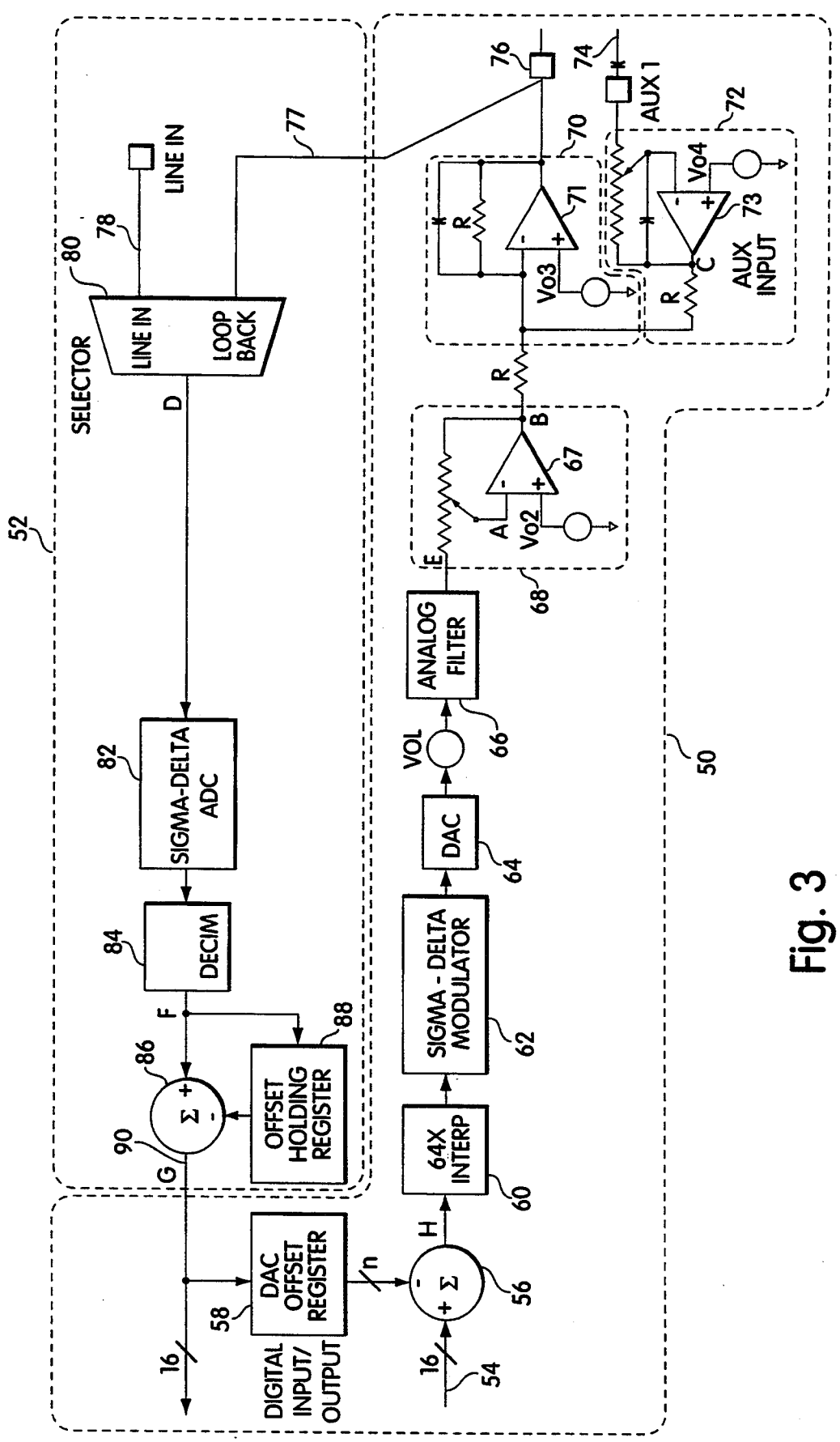
FIG. 3 is a more detailed block diagram of a system according to another embodiment of the present invention.

FIG. 3 shows a system according to another embodiment of the present invention in which the DAC circuitry 50 and the calibration circuitry 52 include sigma-delta architecture. Additionally, the calibration circuitry can be used independently of DAC circuitry 50 as an ADC system. As shown, the DAC circuitry 50 includes digital input terminal 54, summing block 56, DAC offset register 58, interpolation filter 60, sigma-delta modulator 62, DAC 64, analog filter 66 which, in this preferred embodiment, has a nominal passband gain of 1, gain control circuit 68, auxiliary input circuit 72, output summing circuit 70 and analog output terminal 76.

During normal operation, a digital input signal is received on digital input terminal 54 and the digital correction value stored in offset register 58 is subtracted from the digital input signal by summing block 56. The result is provided to the interpolation filter 60 which increases the sampling frequency thereof. The interpolation filter preferably increases the sampling frequency by about 64 times. The oversampled digital signal is provided to sigma-delta modulator 62 which conventionally performs noise shaping on the signal and outputs a digital data stream to DAC 64. The DAC 64 converts the digital data stream to an analog signal which is then filtered by analog filter 66 to reduce the level of quantization noise appearing outside of the signal passband. The filtered analog signal is then fed through gain control circuit 68 to output summing circuit 70. Output summing circuit 70 adds to the analog signal any signal provided by auxiliary input circuit 72. Note that auxiliary input circuit 72 includes an analog input terminal 74 which is AC coupled. The analog sum is provided as an output on output terminal 76. Note that the analog filter 66 has an associated input referred offset error voltage $V_{01}$, the op amp 67 in the gain control circuit 68 has an associated input referred offset error voltage $V_{02}$, the op amp 71 in the output summing circuit 70 has an associated input referred offset error voltage $V_{03}$ and the op amp 73 in the auxiliary input circuit has an associated input referred offset error voltage $V_{04}$. All blocks in FIG. 3 are assumed to be otherwise ideal.

The calibration circuit 52 includes an analog input terminal 78, a selector 80 which selects between the analog input terminal 78 and the feedback line 77, a sigma-delta ADC 82, a decimator 84, a summing block 86, an offset holding register 88, and a digital output terminal 90. The calibration circuit 52 can act independently as an ADC system where an analog input signal is received on analog input terminal 78 and a digital output signal is provided on digital output terminal 90. When operating as an ADC system, the selector 80 would select the analog input terminal 78. The calibration circuit 52 also acts, during calibration mode, to calibrate the DAC system 50. The calibration circuit 52 operates similarly to the calibration circuit 26 described above with respect to FIG. 2. The calibration scheme will, therefore, not be described again herein. Note, however, that, in the embodiment of FIG. 3, $V_{out\ mute} = 3 \times V_{03} - V_{02} - V_{04}$; and $V_{out\ uncal} = 3 \times V_{03} - 2 \times V_{02} + V_{01} - V_{04}$.

During normal operation, like that of the embodiment of FIG. 2, for a digital input signal of midscale code, the voltage at nodes E, A and B will be equal to $V_{02}$ regardless of the level of attenuation of the gain control circuit 68. The average DC level at node C will be equal to $V_{04}$ independent of the average DC level at input terminal 74 and of the attenuation setting of the auxiliary input gain control circuit 72 as its input is AC coupled.

Thus, the present invention provides a calibration circuit and scheme for use with a system which includes gain control circuitry. The advantages offered by the present invention include that clicks and pops will not be heard when volume is discretely adjusted by the user.

While the calibration circuit described herein includes an open-loop arrangement where the offset error voltages are measured directly, converted by the ADC, and stored in a register, it is envisioned that a closed-loop arrangement could be used with a successive approximation or other technique which varies the correction value value until an expected output is obtained.

While the system has been described and shown herein with respect to voltages, it should be appreciated that the system will work similarly with currents or charges.

While the invention has been described herein with respect to particular embodiments, it is contemplated that numerous variations and modifications are possible in light of the above teachings. It is, therefore, to be understood that the foregoing embodiments are presented by way of example only and that, within the scope of the appended claims and equivalents thereto, the invention may be practiced otherwise than as specifically described.

What is claimed is:

1. A system comprising:
   a gain control circuit having an input terminal and an output terminal, receiving an input signal on the input terminal and providing an output signal on the output terminal;
   a calibration circuit, coupled to the gain control circuit, receiving the output signal and producing and storing an correction value for the gain control circuit during a calibration cycle; and
   a summing block, coupled to the calibration circuit and the gain control circuit, combining the stored correction value with the input signal such that, for a predetermined input signal, the output signal remains substantially constant despite any changes in the amount of attenuation or gain provided by the gain control circuit.

2. A system as claimed in claim 1 wherein the gain control circuit includes an operational amplifier having an input terminal and an output terminal, and further including a variable resistor coupled to the input terminal of the operational amplifier.

3. A system as claimed in claim 2 further including a digital-to-analog converter having an input terminal coupled to the summing block and an output terminal coupled to the gain control circuit.

4. A system as claimed in claim 3 wherein the digital-to-analog converter includes a sigma-delta digital-to-analog converter.

5. A system as claimed in claim 3 wherein the calibration circuit includes an analog-to-digital converter having an input terminal coupled to the gain control circuit and an output terminal coupled to the summing block.

6. A system as claimed in claim 5 wherein the calibration circuit further includes an offset register, coupled to the analog-to-digital converter and to the summing block, storing the correction value.

7. A system as claimed in claim 6 wherein the calibration circuit further includes a holding register, coupled to the analog-to-digital converter and to the offset register, storing an intermediate value during the calibration cycle.

8. A system comprising:
a gain control means having an input terminal and an output terminal, for adjusting the gain or attenuation of an input signal received on the input terminal to produce an output signal on the output terminal;
calibration means, coupled to the gain control means, for measuring and storing a correction value for the gain control means during a calibration cycle; and
summing means, coupled to the calibration means and the gain control means, for combining the stored correction value with the input signal such that, for a predetermined input signal, the output signal remains substantially constant despite any changes in the amount of attenuation provided by the gain control means.

9. A system as claimed in claim 8 wherein the gain control means includes an operational amplifier having an input terminal and an output terminal, and further including a variable resistor coupled to the input terminal of the operational amplifier.

10. A system as claimed in claim 9 further including a digital-to-analog converter having an input terminal coupled to the summing means and an output terminal coupled to the gain control means.

11. A system as claimed in claim 10 wherein the digital-to-analog converter includes a sigma-delta digital-to-analog converter.

12. A system as claimed in claim 10 wherein the calibration means includes an analog-to-digital converter having an input terminal coupled to the gain control means and an output terminal coupled to the summing means.

13. A system as claimed in claim 12 wherein the calibration means further includes first storing means, coupled to the analog-to-digital converter and to the summing means, for storing the correction value.

14. A system as claimed in claim 13 wherein the calibration means further includes second storing means, coupled to the analog-to-digital converter and the first storing means, for storing an intermediate value during the calibration cycle.

15. A method for calibrating a system comprising the steps of:
receiving an input signal on an input terminal;
controlling the gain or attenuation of the input signal with a gain control circuit to produce an output signal on an output terminal;
determining a correction value during a calibration cycle;
storing the correction value; and
combining the correction value with the input signal such that, for a predetermined input signal, the output signal remains substantially constant despite any changes in the amount of attenuation provided by the gain control circuit.

16. A method for calibrating a system as claimed in claim 15 wherein the step of determining a correction value includes the steps of:
providing a predetermined input signal on the input terminal;
setting the gain or attenuation of the gain control circuit to a predetermined amount; and
measuring the output signal.

17. A method for calibrating a system as claimed in claim 16 wherein the step of receiving an input signal on an input terminal includes the step of receiving a digital input signal on a digital input terminal.

18. A method for calibrating a system as claimed in claim 17 further including the step of, after the step of receiving a digital input signal on a digital input terminal, converting the combination of the digital input signal and the correction value to an analog signal and providing the analog signal to the gain control circuit.

19. A method for calibrating a system as claimed in claim 18 wherein the step of determining a correction value further includes the step of converting the output signal to a digital signal.

* * * * *